United States Patent
Kumari

(10) Patent No.: US 12,074,605 B2
(45) Date of Patent: Aug. 27, 2024

(54) TIME INTERLEAVING CIRCUIT HAVING GLITCH MITIGATION

(71) Applicant: STMicroelectronics International N.V., Geneva (CH)

(72) Inventor: Aradhana Kumari, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/151,332

(22) Filed: Jan. 6, 2023

(65) Prior Publication Data

US 2023/0231546 A1 Jul. 20, 2023

Related U.S. Application Data

(60) Provisional application No. 63/299,831, filed on Jan. 14, 2022.

(51) Int. Cl.
*H03K 5/1252* (2006.01)
*H03K 5/135* (2006.01)

(52) U.S. Cl.
CPC .......... *H03K 5/1252* (2013.01); *H03K 5/135* (2013.01)

(58) Field of Classification Search
None
See application file for complete search history.

(56) References Cited

U.S. PATENT DOCUMENTS

| | | | |
|---|---|---|---|
| 6,653,867 B1 | 11/2003 | Shihadeh | |
| 6,995,589 B2 | 2/2006 | Chen et al. | |
| 7,482,841 B1 | 1/2009 | Nguyen et al. | |
| 7,577,861 B2* | 8/2009 | Levin | G06F 13/4077 713/400 |
| 7,671,633 B2 | 3/2010 | Kuhn | |
| 7,990,304 B2 | 8/2011 | Lim et al. | |
| 8,786,344 B2 | 7/2014 | Salling | |
| 9,979,381 B1 | 5/2018 | Rasouli et al. | |
| 10,432,183 B2 | 10/2019 | Song et al. | |
| 2019/0313938 A1 | 10/2019 | Taft | |

* cited by examiner

*Primary Examiner* — Cassandra F Cox
(74) *Attorney, Agent, or Firm* — Seed IP Law Group LLP

(57) ABSTRACT

Provided is a time interleaving circuit to mitigate glitches. A first loading stage outputs first data representative of first serialized data. A second loading stage generates second serialized data. The second loading stage receives the first data output by the first loading stage. In response to the first data having a first state, the time interleaving circuit inverts the second serialized data to generate second data representative of the second serialized data. In response to the first data having a second state, the time interleaving circuit outputting the second data without inverting the second serialized data. Exclusive disjunction logic receives the second data and operates on the first data and the second data to generate output data.

20 Claims, 4 Drawing Sheets

TIME INTERLEAVING CIRCUIT HAVING GLITCH MITIGATION

BACKGROUND

Technical Field

The present disclosure is directed to a time interleaving circuit and, in particular, a time interleaving circuit that mitigates glitches in its output data.

Description of the Related Art

A time interleaver typically operates using clock signals that are synchronous in relation to each other. A misalignment in the timing of the clock signals results in introducing glitches in the output data of the time interleaver. A glitch may be manifested in the output data as a brief transition to a different state. The duration of the transition may be shorter than a duration of a clock signal to which the output data is clocked. For example, the duration may be one tenth or one fifth of the duration of the clock signal.

BRIEF SUMMARY

The present disclosure provides a time interleaving circuit that mitigates glitches. The time interleaving circuit includes two loading stages that each serialize data and output the serialized data. The two loading stages are operated using complementary clock signals or clock signals that are phased apart from each other. The time interleaving circuit includes an output stage that further serializes the data output by the two loading stages. The output stage forgoes use of a clock signal or a selection signal to serialize the data.

The output stage serializes the data of the loading stages by taking advantage of the fact that the data of the loading stages change states non-concurrently. The clock signals of the loading stages are phased apart and, accordingly, the state changes of the data of the loading stages are also phased apart. The output stage changes its output data when one of the data provided by the loading stages change states.

The output stage includes exclusive disjunction logic. The exclusive disjunction logic buffers the data of the first loading stage when the second loading stage has a state of logical zero and inverts the data of the first loading stage when the second loading stage has a state of logical one. To neutralize or reverse the inversion, each loading stage includes exclusive disjunction logic that operates pre-invert or pre-buffer the data of the stage. Accordingly, the data is either subjected to inversion twice or buffering twice, and the state of the data remains unaltered.

DETAILED DESCRIPTION

Figure 1:
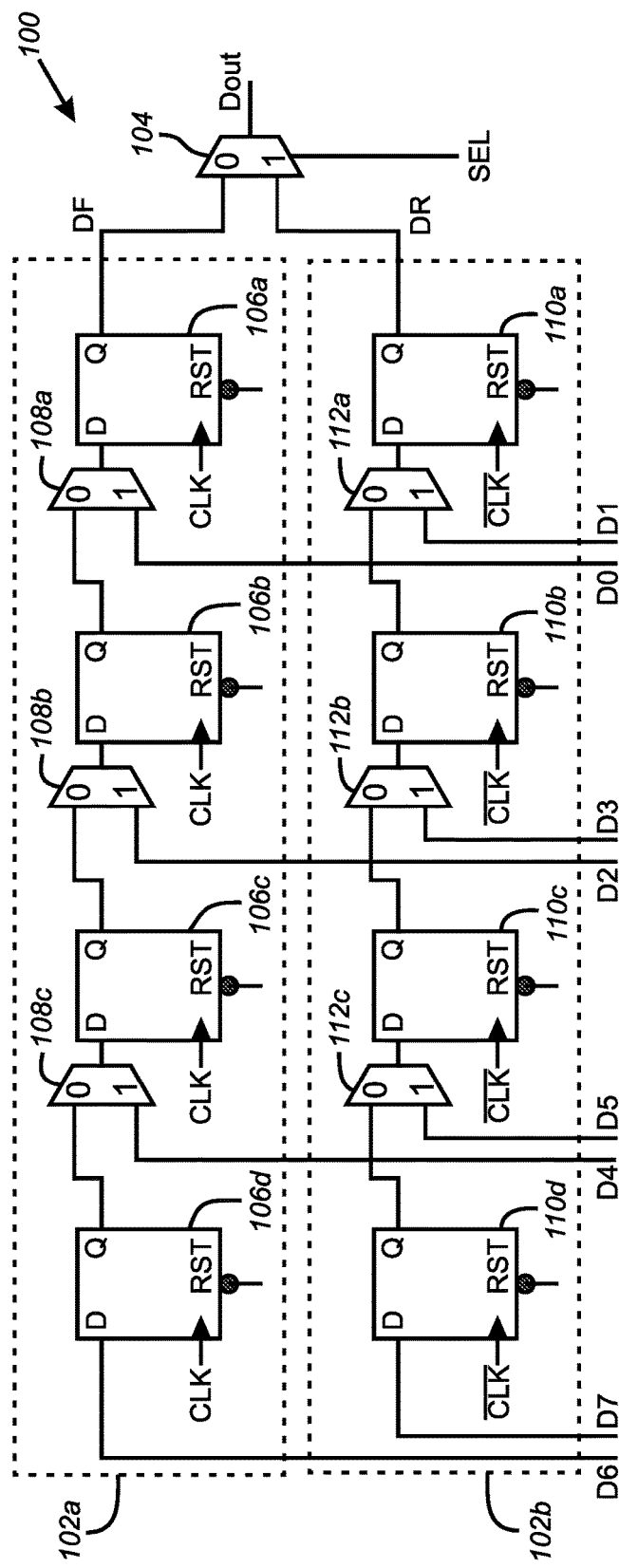
FIG. 1 shows a time interleaving circuit.

FIG. 1 shows a time interleaving circuit 100. The time interleaving circuit 100 includes first and second parallel-to-serial loading stages 102a, 102b and an output multiplexer 104. The output multiplexer 104 has first and second inputs respectively coupled to outputs of the first and second loading stages 102a, 102b. The output multiplexer 104 has an output over which the time interleaving circuit 100 provides output data (Dout). The output multiplexer 104 has a selection input over which the output multiplexer 104 receives an output selection signal (SEL). The output selection signal (SEL) indicates whether the output multiplexer 104 is to output data received over the first input or the second input.

The first and second loading stages 102a, 102b operate at different phases of a clock signal. Each loading stage 102 has a plurality of inputs that are coupled to a plurality of data lines, respectively. For example, the plurality of data lines may be each coupled to a respective device that supplies data to a bus (such as a Mobile Industry Processor Interface (MIPI) I3C or SenseWire bus). The time interleaving circuit 100 may receive the plurality of data from the devices, over the plurality of data lines, and provide the output data (Dout) for the bus. The loading stage 102 receives data over the plurality of inputs in parallel and serializes and outputs the data to the output multiplexer 104. In particular, the first loading stage 102a serializes data of a plurality of first data lines D0, D2, D4, D6. The second loading stage 102b serializes data of a plurality of second data lines D1, D3, D5, D7.

The first loading stage 102a includes a plurality of flip-flops 106a, 106b, 106c, 106d. The flip-flops 106a, 106b, 106c, 106d may each be any latch, edge-triggered bit storage device or level-triggered bit storage device. The plurality of flip-flops 106a, 106b, 106c, 106d include a last flip-flop 106a, one or more intervening flip-flops 106b, 106c and a first flip-flop 106d. Although four flip-flops are shown in each loading stage 102a, 102b, any number of flip-flops may be used a stage. It is noted, however, that for a loading stage 102a, 102b to serialize data more than one flip-flop are used. If a loading stage 102a, 102b has one flip-flop, the serializing data by the circuit 100 is performed by the output multiplexer 104.

The first loading stage 102a includes a plurality of multiplexers 108a, 108b, 108c respectively associated with the last flip-flop 106a and the one or more intervening flip-flops 106b, 106c of the plurality of flip-flops. The first flip-flop 106d is not associated with a corresponding multiplexer due to the fact that selection between data lines is not performed at the first flip-flop 106d.

The first flip-flop 106d has a data input coupled to a respective data line, a clock input configured to receive a clock signal (CLK), a reset input configured to receive a reset signal for resetting the first flip-flop 106d and an output configured to output a data signal. Each multiplexer 108a, 108b, 108c has a first input coupled to the output of a preceding flip-flop in a serial chain, a second input configured to receive a respective data signal of the multiplexer 108a, 108b, 108c and an output coupled to a succeeding flip-flop in the serial chain, whereby the succeeding flip-flop is one of: the last flip-flop 106a and the one or more intervening flip-flops 106b, 106c. Each multiplexer 108a, 108b, 108c has a selection input (not shown) for receiving a respective selection signal. The plurality of selection signals of the plurality of multiplexers 108a, 108b, 108c are operated (e.g., at the rising edges of the clock signal (CLK)) to cause the first loading stage 102a to serialize the data of the plurality of first data lines D0, D2, D4, D6. The one or more intervening flip-flops 106b, 106c each have a data input coupled to the output of the corresponding multiplexer 108b, 108c, a clock input configured to receive the clock signal (CLK), a reset input configured to receive a reset signal for resetting the flip-flop 106b, 106c and an output coupled to the first input of the succeeding multiplexer in the serial chain. The last flip-flop 106a is similarly configured and coupled as the one or more intervening flip-flops 106b, 106c. However, the output of the last flip-flop 106a is coupled to the first input of the output multiplexer 104.

The second stage 102b includes a plurality of flip-flops 110a, 110b, 110c, 110d and a plurality of multiplexers 112a, 112b, 112c. The flip-flops 110a, 110b, 110c, 110d of the second stage 102b are structured and coupled similarly to the flip-flops 106a, 106b, 106c, 106d, respectively, of the first stage 102a, and the multiplexers 112a, 112b, 112c of the second stage 102b are structured and coupled similarly to the multiplexers 108a, 108b, 108c, respectively, of the first stage 102a. The second stage 102b serializes different data than the first stage 102a. The second stage 102b is coupled to second data lines D1, D3, D5, D7, whereby the second inputs of the multiplexers 112a, 112b, 112c are respectively coupled to the second data lines D1, D3, D5. The data input of the first flip-flop 106d of the second stage 102b has a data input coupled to a data line (D7).

The second stage 102b operates at a different clock phase than the first stage 102a. The second stage 102b operates at a complementary clock signal ($\overline{CLK}$) to that of the clock signal (CLK). The complementary clock signal ($\overline{CLK}$) may be offset by half a clock cycle from the clock signal (CLK). The clock inputs of the flip-flops 110a, 110b, 110c, 110d of the second stage 102b receive the complementary clock signal ($\overline{CLK}$). Further, the selection signals of the multiplexers 112a, 112b, 112c may be offset from the selection signals of the multiplexers 108a, 108b, 108c by a phase difference between the clock signal (CLK) and the complementary clock signal ($\overline{CLK}$). Alternatively, the second stage 102b may serialize data in a different order than the first stage 102a, and the selection signals used by the second stage 102b may be different than the selection signals used by the first stage 102a even when adjusting for the clock phase offset.

During operation, the first stage 102a receives data over the first data lines D0, D2, D4, D6, respective selection signals and the clock signal (CLK). The first stage 102a serializes the data of the first data lines D0, D2, D4, D6 and outputs first serialized data (DF) to the output multiplexer 104. The first serialized data (DF) is output at a rate of the clock signal (CLK), whereby the first stage 102a, in each clock cycle, outputs data provided by one of the first data lines D0, D2, D4, D6. The first stage 102a may sequentially cycle or rotate through the data of the first data lines D0, D2, D4, D6 and output the data one at a time (one in each clock cycle of the clock signal (CLK)). Because the first stage 102a includes four flip-flops (N=4), the rate of the clock signal (CLK) may be four times (xN) the rate of one or more domains of the first data lines (e.g., devices outputting data on the data lines).

Similarly, the second stage 102b receives data over the second data lines D1, D3, D5, D7, respective selection signals and complementary clock signal ($\overline{CLK}$). The second stage 102b serializes the data and outputs second serialized data (DR) to the output multiplexer 104. The second serialized data (DR) is output at the same rate as the first serialized data (DF).

The output multiplexer 104 receives the first serialized data (DF), the second serialized data (DR) and the output selection signal. The first serialized data (DF) is clocked to the clock signal (CLK), whereas the second serialized data (DR) is clocked to the complementary clock signal ($\overline{CLK}$). Data of the first serialized data (DF) is provided between two rising edges of the clock signal (CLK), and data of the second serialized data (DR) is provided between two falling edges of the clock signal (CLK).

The output selection signal (SEL) may be the same as the clock signal (CLK) or as the complementary clock signal ($\overline{CLK}$). The output data (Dout) may alternate between the first serialized data (DF) and the second serialized data (DR) every half cycle of the clock signal (CLK) or the complementary clock signal ($\overline{CLK}$).

Figure 2:
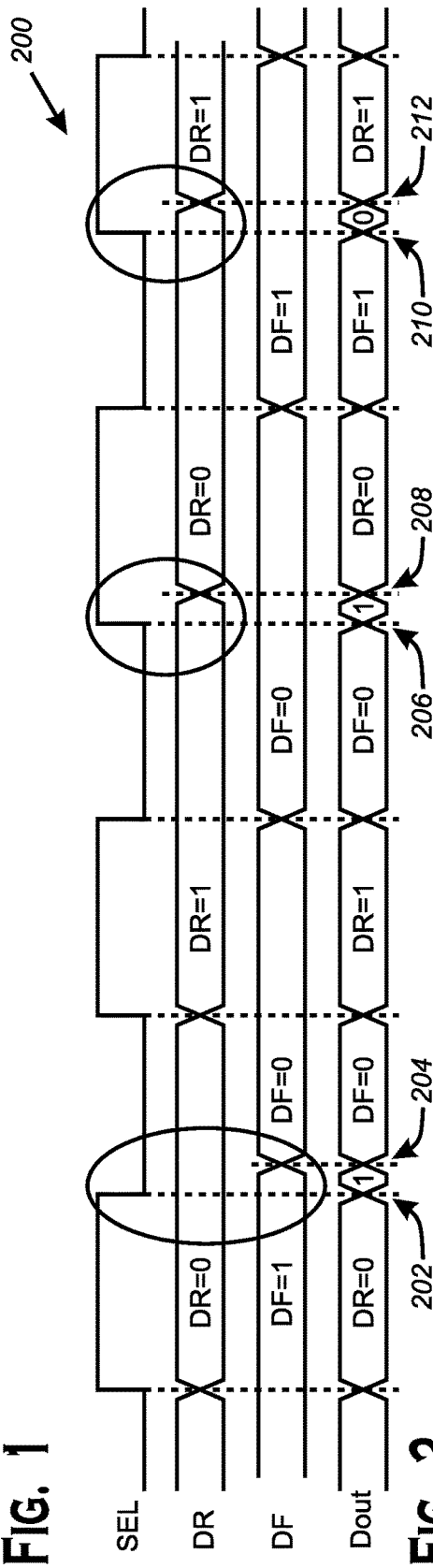
FIG. 2 shows a timing diagram of the time interleaving circuit described with reference to FIG. 1.

FIG. 2 shows a timing diagram 200 of the time interleaving circuit 100 described with reference to FIG. 1. The timing diagram 200 shows the output selection signal (SEL), the first serialized data (DF), the second serialized data (DR) and the output data (Dout). The output selection signal (SEL) corresponds to the complementary clock signal ($\overline{CLK}$). When the output selection signal (SEL) is has a first state (or is asserted or a logical one), the time interleaving circuit 100 outputs the second serialized data (DR). When the output selection signal (SEL) is has a second state (or is deasserted or a logical zero), the time interleaving circuit 100 outputs the first serialized data (DF).

If the first serialized data (DF) or the second serialized data (DR) has a glitch, the glitch propagates to the output data (Dout). For example, between a first time instant 202 and a second time instant 204, the first serialized data (DF) is late to changes states. The delay in the change of states may be due to a mistiming of the clock signal (CLK). Due to the glitch, the first serialized data (DF) transitions from a logical one to a logical zero after the falling edge of the output selection signal (SEL) instead of concurrently with the falling edge. Accordingly, the output data (Dout) has a state of logical one between the first and second time instants 202, 204. After the second time instant 204, the output data (Dout) transitions to logical zero in accordance with the first serialized data (DF).

Similarly, late transitions of the second serialized data (DR) cause glitches in the output data (Dout) between third and fourth time instants 206, 208 and fifth and sixth time instants 210, 212. Between the third and fourth time instants 206, 208, the output data (Dout) has a state of logical one due to the timing glitch, whereas the output data (Dout) should have a state of logical zero. Between the fifth and sixth time instants 210, 212, the output data (Dout) has a state of logical zero due to the timing glitch, whereas the output data (Dout) should have a state of logical one.

The glitches may be mitigated by passing the output data (Dout) through a flip-flop operated with a clock signal having a rate that is twice the clock rate of the output selection signal (SEL) (and of the clock signal (CLK) and the complementary clock signal ($\overline{CLK}$)). However, a clock signal having double the rate may not available to operate the flip-flop.

Figure 3:
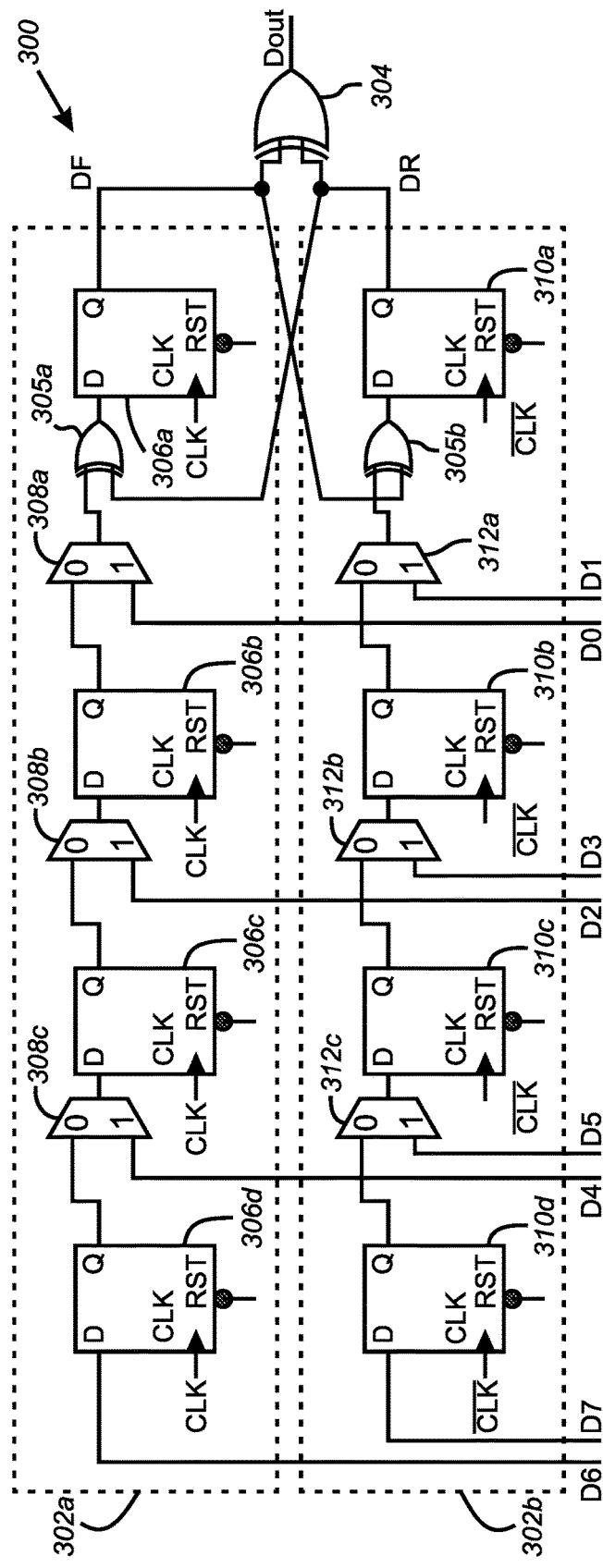
FIG. 3 shows a time interleaving circuit in accordance with an embodiment.

FIG. 3 shows a time interleaving circuit 300 in accordance with an embodiment. The time interleaving circuit 300 forgoes use of the output multiplexer and the output selection signal (SEL) thereof. Forgoing use of the output selection signal (SEL) removes the impact of mismatches between the timing of the output selection signal (SEL) and the timing of the clock signal (CLK) or the complementary clock signal ($\overline{CLK}$) on operation of the time interleaving circuit 300. The time interleaving circuit 300 includes combinational logic for buffering its output data and mitigate glitches.

The time interleaving circuit 300 includes first and second parallel-to-serial loading stages 302a, 302b and output logic that is an output exclusive disjunction digital logic gate 304 (an exclusive or (XOR) gate). The output exclusive disjunction gate 304 has first and second inputs and an output.

The first loading stage 302a includes a plurality of flip-flops 306a, 306b, 306c, 306d. The plurality of flip-flops include a last flip-flop 306a, one or more intervening flip-flops 306b, 306c and a first flip-flop 306d. The first loading stage 302a includes a plurality of multiplexers 308a, 308b, 308c and a first exclusive disjunction gate 305a. The first exclusive disjunction gate 305a has first and second inputs and an output.

In the first loading stage 302a of the time interleaving circuit 300, the output of the multiplexer 308a associated with the last flip-flop 306a is coupled to the first input of the first exclusive disjunction gate 305a. The second input of the first exclusive disjunction gate 305a is coupled to the output of the second stage 302b, and the output of the first exclusive disjunction gate 305a is coupled to the data input of the last flip-flop 306a.

The second loading stage 302b includes a plurality of flip-flops 310a, 310b, 310c, 310d. The plurality of flip-flops include a last flip-flop 310a, one or more intervening flip-flops 310b, 310c and a first flip-flop 310d. The second loading stage 302b includes a plurality of multiplexers 312a, 312b, 312c respectively associated with the last flip-flop 310a and the one or more intervening flip-flops 310b, 310c and a second exclusive disjunction gate 305b. The second exclusive disjunction gate 305b has first and second inputs and an output. In the second loading stage 302b of the time interleaving circuit 300, the output of the multiplexer 312a associated with the last flip-flop 310a is coupled to the first input of the first exclusive disjunction gate 305b. The second input of the first exclusive disjunction gate 305a is coupled to the output of the first stage 302a, and the output of the first exclusive disjunction gate 305a is coupled to the data input of the last flip-flop 310a.

The first input of the output exclusive disjunction gate 304 is coupled to the output of the first loading stage 302a for receiving the first serialized data (DF) and the second input of the output exclusive disjunction gate 304 is coupled to the output of the second loading stage 302b for receiving the second serialized data (DR). The output of the output exclusive disjunction gate 304 provides the output data (Dout).

During operation, the first serialized data (DF) and the second serialized data (DR) are expected to change states, if at all, at different times. The first and second loading stages 302a, 302b are operated at different phases of the clock signal (CLK). Thus, the serialized data (DF, DR) changes states half of a clock cycle apart. If a mistiming occurs that delays or advances the state change, the delay or advance is not expected to be as much as half of the clock cycle.

The output exclusive disjunction gate 304 buffers the output data (Dout) to mitigate glitches. The output exclusive disjunction gate 304 further serializes the first and second data (DF, DR) taking advantage of the fact that when one of the first or second data (DF, DR) may change, the other is static. If the static data is logical zero, the output exclusive disjunction gate 304 operates as a buffer on the other input data and passes the other input data to the output without change. If the static data is logical one, the output exclusive disjunction gate 304 operates as an inverter on the other input data. Accordingly, the first and second exclusive disjunction gates 305a, 305b are employed for further inversion or buffering.

When, the second serialized data (DR) has a state of logical zero, the first serialized data (DF) may have a new state at the next rising edge of the clock signal (CLK). The first exclusive disjunction gate 305a receives a logical one or logical zero from the first multiplexer 308a. The first exclusive disjunction gate 305a receives the logical zero of the second serialized data (DR). The first exclusive disjunction gate 305a performs exclusive disjunction on the data received over its inputs. The first exclusive disjunction gate 305a outputs data that is the exclusive disjunction of the data received on the inputs.

Because the second serialized data (DR) is a logical zero, the first exclusive disjunction gate 305a performs an exclusive disjunction operation by passing the output of the first multiplexer 308a without inversion to the data input of the first flip-flop 306a. When exclusive disjunction is performed on two inputs and one of the two inputs is zero, the result of the exclusive disjunction is the second input. For example, the exclusive disjunction of two zero inputs is zero but the exclusive disjunction of zero and one is one.

At the rising edge of the clock signal (CLK), the first flip-flop 306a outputs the logical one or logical zero to the output exclusive disjunction gate 304. Again, the output exclusive disjunction gate 304 receives the logical zero of the second serialized data (DR). The output exclusive disjunction gate 304 receives the logical one or logical zero from the first flip-flop 306a and outputs the logical one or logical zero as the output data (Dout).

When, the second serialized data (DR) has a state of logical one, the first exclusive disjunction gate 305a inverts its other input. The exclusive disjunction of one and zero is one and the exclusive disjunction of two ones is zero. Thus, holding one of the inputs at one, the first exclusive disjunction gate 305a inverts the other input. The first exclusive disjunction gate 305a receives a logical one or logical zero from the first multiplexer 308a and inverters the logical one or logical zero at its output. At the rising edge of the clock signal (CLK), the first flip-flop 306a outputs the inversion of the logical one or logical zero to the output exclusive disjunction gate 304. The output exclusive disjunction gate 304 receives, at its first input, the logical one of the second serialized data (DR). The output exclusive disjunction gate 304 inverts a bit received at its second input. The output exclusive disjunction gate 304 receives, at its second input, the inversion of the logical one or logical zero from the first flip-flop 306a and operates as an inverter to restore the logical one or logical zero (by performing a second inversion).

The time interleaving circuit 300 forgoes the use of the selection signal (SEL) at the output. The removal of the selection signal (SEL) results in removing glitches resulting from timing misalignments between state transitions of the selection signal (SEL) and the clock signal (CLK) or the complementary clock signal ($\overline{CLK}$). The output exclusive disjunction gate 304 operates in a clock-free manner and does not utilize a clock signal for operation. The output exclusive disjunction gate 304 transitions the state of the output data (Dout) at the time when one of the first or second serialized data (DF, DR) changes states. The time interleaving circuit 300 avoids introducing glitches in the output data (Dout) as a result of the selection signal (SEL) transitioning between states before the clock signal (CLK) or the complementary clock signal ($\overline{CLK}$) transitions between states.

Figure 4:
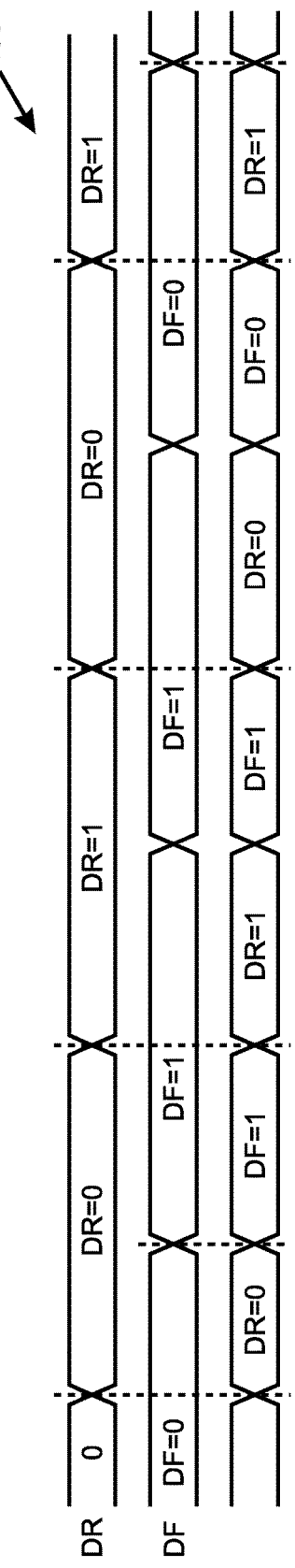
FIG. 4 shows a timing diagram of the time interleaving circuit described with reference to FIG. 3.

FIG. 4 shows a timing diagram 400 of the time interleaving circuit 300 described with reference to FIG. 3. The timing diagram 400 shows the first and second serialized data (DF, DR) and the output data (Dout). The output data (Dout) transitions between states at the time when one of the first or second serialized data (DF, DR) changes states. The output data (Dout) does not include glitches due to the fact that transitions are synchronous with the clock signal (CLK) and the complementary clock signal ($\overline{CLK}$) driving the first and second loading stages 302a, 302b, respectively.

Figures 5, 6:
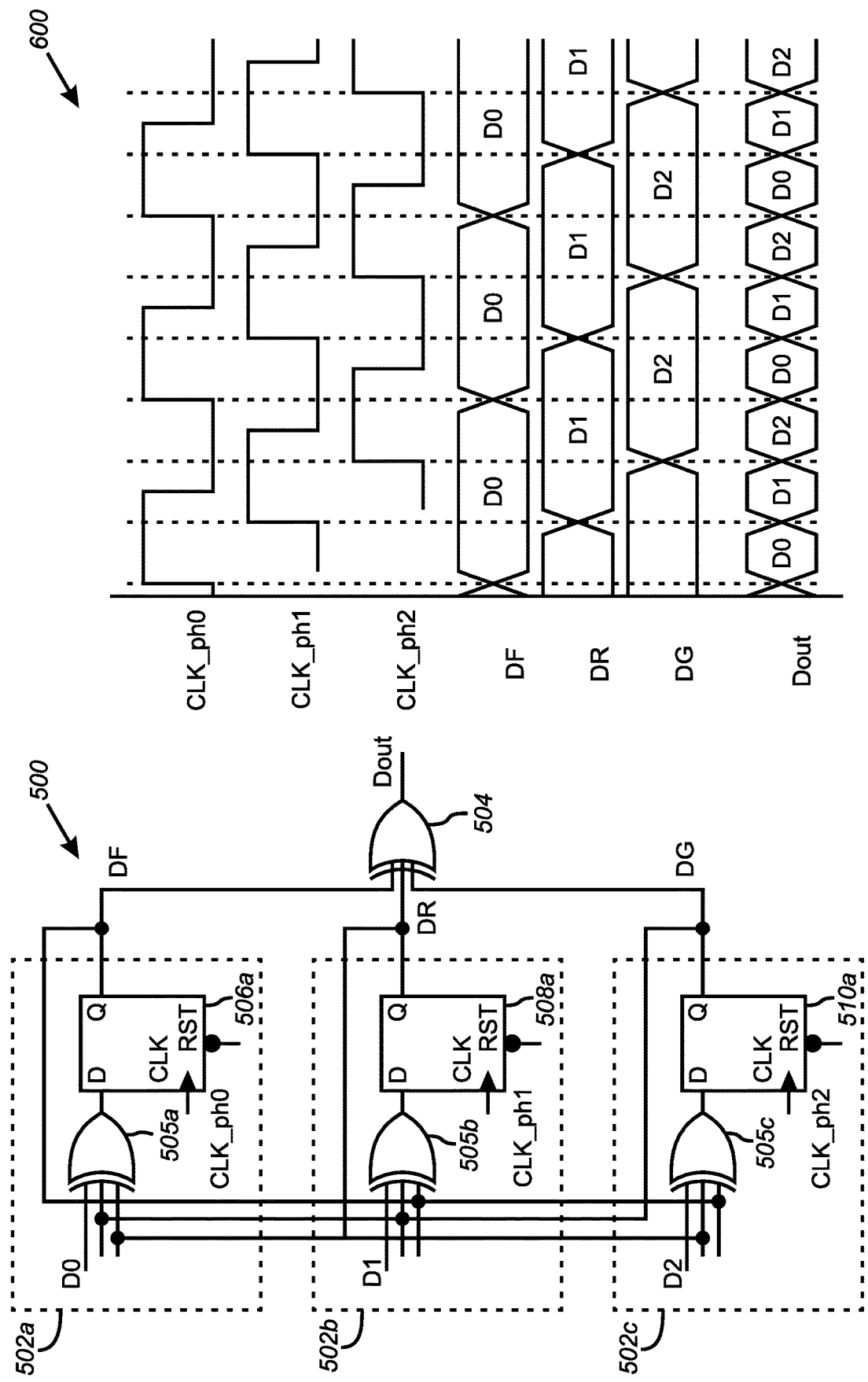
FIG. 5 shows a time interleaving circuit including three loading stages in accordance with an embodiment.
FIG. 6 shows a timing diagram of the time interleaving circuit described with reference to FIG. 5.

FIG. 5 shows a time interleaving circuit 500 including three loading stages 502a, 502b, 502c in accordance with an embodiment. The loading stages 502a, 502b, 502c include a first loading stage 502a, a second loading stage 502b and a third loading stage 502c. The first loading stage 502a is operated at a first clock signal (CLK_ph0), the second loading stage 502b is operated at a second clock signal (CLK_ph1) and the third loading stage 502c is operated at a third clock signal (CLK_ph2). The first, second and third clock signals (CLK_ph0, CLK_ph1, CLK_ph2) have the same clock cycle duration but are phased from each other by one third (i.e., a reciprocal of the number of stages N=3) of the clock cycle duration.

In each loading stage 502a, 502b, 502c, a respective last flip-flop 506a, 508a, 510a and respective exclusive disjunction gate 505a, 505b, 505c are shown. Remaining elements of the loading stages 502a, 502b, 502c are not illustrated to facilitate description. The time interleaving circuit 500 also includes an output exclusive disjunction gate 504. The output exclusive disjunction gate 504 has three inputs respectively coupled to the outputs of the loading stages 502a, 502b, 502c and an output for providing the output data (Dout). The output exclusive disjunction gate 504 receives first serialized data (DF) from the first loading stage 502a, second serialized data (DR) from the second loading stage 502b and third serialized data (DG) from the third loading stage 502c. The output exclusive disjunction gate 504 serializes the first, second and third data (DF, DR, DG) and outputs the output data (Dout). The output exclusive disjunction gate 504 is a three-input XOR gate. The logical state of the output of the output exclusive disjunction gate 504 corresponds to the logical state shared by an odd number of inputs (i.e., one or three inputs). Thus, holding two of the three data (DF, DR, DG) to the same value, the output exclusive disjunction gate 504 either inverts or does not invert the third data at the output. Whether the third data is inverted depends on the logical states of the two other inputs.

In each loading stage 502a, 502b, 502c, the respective exclusive disjunction gate 505a, 505b, 505c receives data pertaining to the loading stage as well as the serialized data of the two remaining loading stages. As described herein, the respective exclusive disjunction gate 505a, 505b, 505c of the loading stage 502a, 502b, 502c operates to buffer or invert the data pertaining to the loading stage in accordance with the buffering or inversion performed by the output exclusive disjunction gate 504. Although three loading stages are shown in the time interleaving circuit 500, the number of loading stages may be any number greater than three.

FIG. 6 shows a timing diagram 600 of the time interleaving circuit 500 described with reference to FIG. 5. The first, second and third data (DF, DR, DG) can transition between states at the rising edges of the first, second and third clock signals (CLK_ph0, CLK_ph1, CLK_ph2), respectively. The output exclusive disjunction gate 504, thus, operates to cause the output data (Dout) to switch to the first serialized data (DF) at the rising edge of the first clock signal (CLK_ph0), the second serialized data (DR) at the rising edges of the second clock signal (CLK_ph1) and the third serialized data (DG) at the rising edges of the third clock signal (CLK_ph2).

Figure 7:
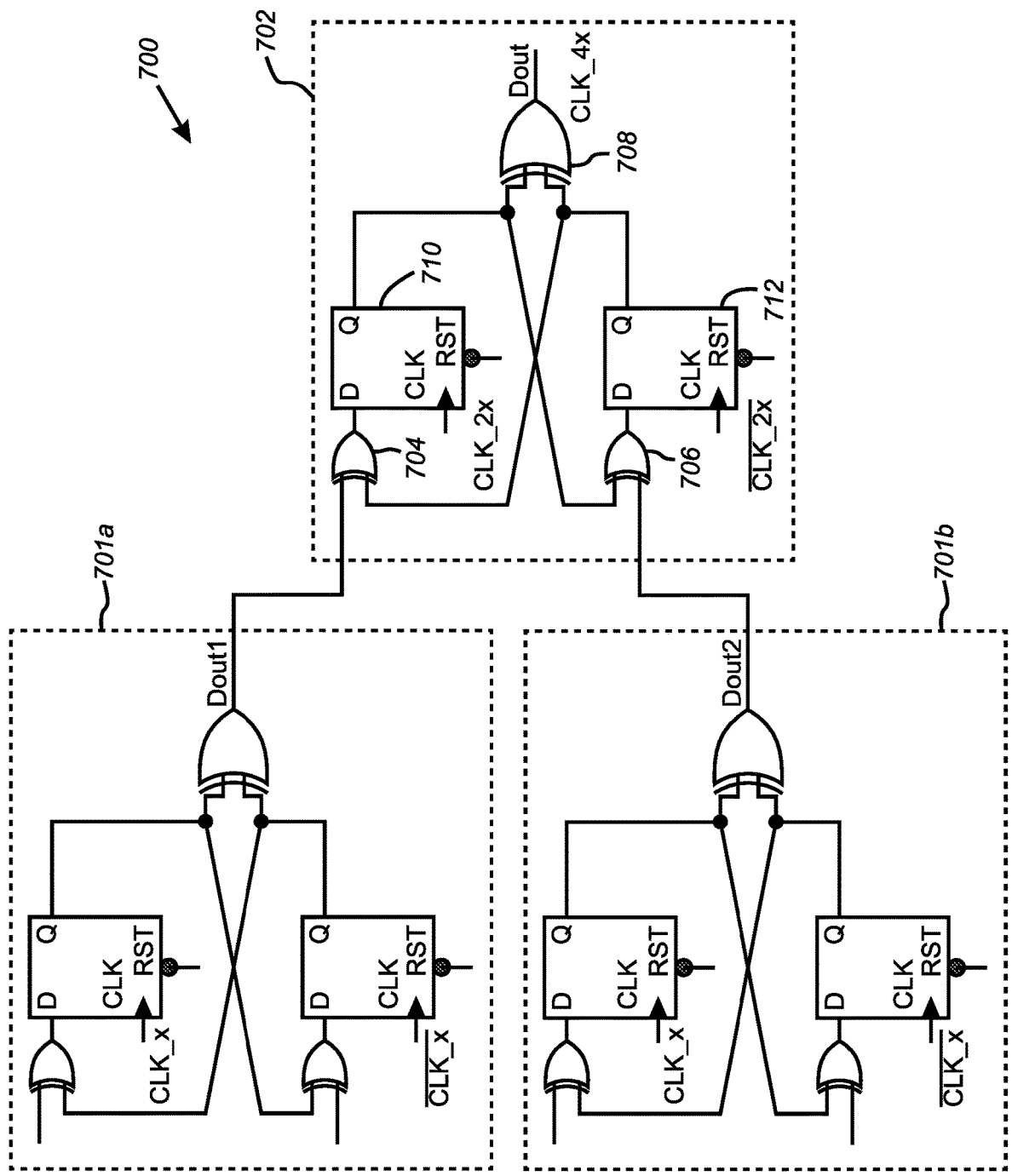
FIG. 7 shows a cascaded time interleaving circuit in accordance with an embodiment.

FIG. 7 shows a cascaded time interleaving circuit 700 in accordance with an embodiment. The cascaded time interleaving circuit 700 includes first and second time interleaving circuits 701a, 701b and an output stage 702. The first and second time interleaving circuits 701a, 701b may be similarly configured as the time interleaving circuit 300 described with reference to FIG. 3. The first and second time interleaving circuits 701a, 701b are each operated using the same clock signals; a first clock signal (CLK_x) and a first complementary clock signal ($\overline{CLK\_x}$) that is complementary of the first clock signal (CLK_x). The first and second time interleaving circuits 701a, 701b have respective outputs. The first and second time interleaving circuits 701a, 701b respectively output data (Dout1, Dout2) to the output stage 702.

The output stage 702 includes first, second and third exclusive disjunction gates 704, 706, 708 and first and second flip-flops 710, 712. The first exclusive disjunction gate 704 has a first input coupled to the output of the first time interleaving circuit 701a, a second input and an output. The second exclusive disjunction gate 706 has a first input, a second input coupled to the output of the second time interleaving circuit 701b and an output.

The first flip-flop 710 has a data input coupled to the output of the first exclusive disjunction gate 704, a clock input configured to receive a second clock signal (CLK_2x) that is twice the rate of the first clock signal (CLK_x), a reset input configured to receive a reset signal and an output. The output of the first flip-flop 710 is coupled to the first input of the second exclusive disjunction gate 706. The second flip-flop 712 has a data input coupled to the output of the second exclusive disjunction gate 706, a clock input configured to receive a second complementary clock signal ($\overline{CLK\_2x}$) that is complementary of the second clock signal (CLK_2x), a reset input configured to receive a reset signal and an output. The output of the second flip-flop 712 is coupled to the second input of the first exclusive disjunction gate 704.

The third exclusive disjunction gate 708 has first and second inputs respectively coupled to the outputs of the first and second flip-flops 710, 712. The third exclusive disjunction gate 708 has an output configured to output data (Dout) of the cascaded time interleaving circuit 700. The output data (Dout) interleaves the output data (Dout1, Dout2) of the first and second time interleaving circuits 701a, 701b. The output data (Dout) has a rate that is four times the rate of the first clock signal (CLK_x) with which the first and second time interleaving circuits 701a, 701b are operated and twice the rate of the second clock signal (CLK_2x) with which the output stage 702 is operated.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a first loading stage configured to:
output first data representative of first serialized data;
a second loading stage configured to:
generate second serialized data;
receive the first data;
in response to the first data having a first state,
invert the second serialized data to generate second data representative of the second serialized data; and
output the second data; and
in response to the first data having a second state, output the second data without inverting the second serialized data; and
exclusive disjunction logic configured to:
receive the first and second data; and
operate on the first data and the second data to generate output data.

2. The circuit of claim 1, wherein the exclusive disjunction logic performs an exclusive disjunction operation on the first data and the second data, the exclusive disjunction logic generates the output data to serialize the first and second serialized data.

3. The circuit of claim 1, wherein the first loading stage operates according to a first clock signal, and the first loading stage operates according to a second clock signal that is complementary of the first clock signal.

4. The circuit of claim 3, wherein the exclusive disjunction logic generates the output data at a clock rate that is double a clock rate of the first clock signal.

5. The circuit of claim 1, wherein the exclusive disjunction logic is clock-free.

6. The circuit of claim 1, wherein the first loading stage includes:
first exclusive disjunction logic configured to:
receive the second data and the first serialized data;
in response to a state of the second data being the same as a state of the first serialized data, pass the first serialized data as the first data without inverting the first serialized data; and
in response to the state of the second data being different than the state of the first serialized data, invert the first serialized data to generate the first data.

7. The circuit of claim 1, wherein the second loading stage includes:
second exclusive disjunction logic configured to:
receive the first data and the second serialized data;
in response to a state of the first data being the same as a state of the second serialized data, pass the second serialized data as second first data without inverting the second serialized data; and
in response to the state of the first data being different than the state of the second serialized data, invert the second serialized data to generate the second data.

8. A method, comprising:
outputting, by a first loading stage, first data representative of first serialized data;
generating, by a second loading stage, second serialized data;
receiving, by the second loading stage, the first data;
in response to the first data having a first state, inverting the second serialized data to generate second data representative of the second serialized data and in response to the first data having a second state, outputting the second data without inverting the second serialized data;
receiving, by exclusive disjunction logic, the first and second data; and
performing an exclusive disjunction operation on the first data and the second data to generate output data.

9. The method of claim 8, comprising:
generating, by the exclusive disjunction logic, the output data to serialize the first and second serialized data.

10. The method of claim 8, wherein the first loading stage operates according to a first clock signal, and the first loading stage operates according to a second clock signal that is complementary of the first clock signal.

11. The method of claim 10, wherein the exclusive disjunction logic generates the output data at a clock rate that is double a clock rate of the first clock signal.

12. The method of claim 8, comprising:
receiving, by first exclusive disjunction logic of the first loading stage, the second data and the first serialized data; and
in response to a state of the second data being the same as a state of the first serialized data, passing the first serialized data as the first data without inverting the first serialized data and in response to the state of the second data being different than the state of the first serialized data, inverting the first serialized data to generate the first data.

13. The method of claim 8, comprising:
receiving, by second exclusive disjunction logic of the second loading stage, the first data and the second serialized data; and
in response to a state of the first data being the same as a state of the second serialized data, passing the second serialized data as second first data without inverting the second serialized data and in response to the state of the first data being different than the state of the second serialized data, inverting the second serialized data to generate the second data.

14. A system, comprising:
a plurality of first data lines;
a plurality of second data lines;
a first loading stage coupled to the plurality of first data lines and configured to:
serialize parallel-loaded data of the plurality of first data lines into first serialized data; and
output first data representative of the first serialized data;
a second loading stage coupled to the plurality of second data lines and configured to:
serialize parallel-loaded data of the plurality of second data lines into second serialized data;
receive the first data;
in response to the first data having a first state,
invert the second serialized data to generate second data representative of the second serialized data; and
output the second data; and
in response to the first data having a second state, output the second data without inverting the second serialized data; and
exclusive disjunction logic configured to:
receive the first and second data; and
operate on the first data and the second data to generate output data.

15. The system of claim 14, wherein the exclusive disjunction logic generates the output data to serialize the first and second serialized data.

16. The system of claim 14, wherein:
The exclusive disjunction logic is configured to perform an exclusive disjunction operation on the first data and the second data, and
the first loading stage operates according to a first clock signal, and the first loading stage operates according to a second clock signal that is complementary of the first clock signal.

17. The system of claim 16, wherein the exclusive disjunction logic generates the output data at a clock rate that is double a clock rate of the first clock signal.

18. The system of claim 14, wherein the exclusive disjunction logic is clock-free.

19. The system of claim 14, wherein the first loading stage includes:
first exclusive disjunction logic configured to:
receive the second data and the first serialized data;
in response to a state of the second data being the same as a state of the first serialized data, pass the first serialized data as the first data without inverting the first serialized data; and
in response to the state of the second data being different than the state of the first serialized data, invert the first serialized data to generate the first data.

20. The system of claim 14, wherein the second loading stage includes:
second exclusive disjunction logic configured to:
receive the first data and the second serialized data;
in response to a state of the first data being the same as a state of the second serialized data, pass the second serialized data as second first data without inverting the second serialized data; and
in response to the state of the first data being different than the state of the second serialized data, invert the second serialized data to generate the second data.

\* \* \* \* \*